(12) United States Patent
Yang et al.

(10) Patent No.: US 7,566,854 B2
(45) Date of Patent: Jul. 28, 2009

(54) IMAGE SENSOR MODULE

(75) Inventors: Wen-Kun Yang, Hsin-Chu (TW); Jui-Hsien Chang, Jhudong Township, Hsinchu County (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 11/608,254

(22) Filed: Dec. 8, 2006

(65) Prior Publication Data

US 2008/0135728 A1    Jun. 12, 2008

(51) Int. Cl.
*G01B 9/02* (2006.01)
(52) U.S. Cl. .................... 250/208.1; 250/216; 250/239; 257/678; 257/433
(58) Field of Classification Search ............. 250/208.1, 250/216, 239; 257/428, 431–434, 680, 686, 257/778, 678; 438/108, 116, 125–127
See application file for complete search history.

(56) References Cited

U.S. PATENT DOCUMENTS

| | | | |
|---|---|---|---|
| 5,514,888 A | 5/1996 | Sano et al. ................... 257/232 |
| 6,483,101 B1 * | 11/2002 | Webster ...................... 250/216 |
| 7,268,335 B2 * | 9/2007 | Hiltunen .................. 250/208.1 |
| 7,279,782 B2 * | 10/2007 | Yang et al. ................... 257/680 |
| 2003/0042587 A1 * | 3/2003 | Lee ............................. 257/678 |
| 2005/0161805 A1 * | 7/2005 | Ono et al. .................... 257/704 |
| 2005/0242408 A1 * | 11/2005 | Yang et al. ................... 257/428 |
| 2005/0242409 A1 * | 11/2005 | Yang et al. ................... 257/428 |
| 2006/0109367 A1 * | 5/2006 | Hirooka ...................... 348/340 |
| 2007/0210246 A1 * | 9/2007 | Ellenberger et al. ......... 250/239 |

\* cited by examiner

*Primary Examiner*—Georgia Y Epps
*Assistant Examiner*—Tony Ko
(74) *Attorney, Agent, or Firm*—Kusner & Jaffe

(57) ABSTRACT

The present invention provides an image sensor module. The image sensor module has a die formed on a substrate, the die having a micro lens area, a lens holder formed on the substrate and over the die, a lens formed in the lens holder. A filter is formed within the lens holder and between the lens and the die, and at least one passive device formed on the substrate and covered within the lens holder. Conductive bumps or LGA (leadless grid array) are formed on the bottom surface of the substrate.

19 Claims, 3 Drawing Sheets

IMAGE SENSOR MODULE

BACKGROUND OF THE INVENTION

1. Field of the Invention

This invention relates to an image sensor, and more particularly to an image sensor module and the method of forming the same.

2. Description of the Prior Art

With the spread of digital cameras, a demand for solid imaging devices has risen in recent years. The attention has recently been riveted to CMOS image sensors which can be manufactured by complementary metal-oxide semiconductors (CMOS) technology, and the unit cost of the production of which is low. The pixel section of the CMOS image sensor includes a plurality of unit pixels arranged in the form of a matrix. Each of the unit pixels includes a photodiode and a readout transistor configured to read out signal charges accumulated in the photodiode. A gate voltage generator is connected to a gate electrode of the readout transistor. A select switch switches a voltage applied to the gate electrode so as to turn on and off the readout transistor.

As aforementioned, the digital image technique has been wildly applied to image shooting instrument such as digital camera, image scanner, etc. The conventional CMOS sensor is disposed on a circuit board. The CMOS sensor has a die secured therein. The lens seat has a focusing lens for focusing the image onto the die of the CMOS sensor. Through the lens, the image signal is sent by the die to a digital processor for converting the analog signal into digital signal. The Die of the CMOS sensor is relatively sensitive to infrared ray and dust particles. If the unwanted particles are not removed from the sensor, it leads to downgrade the quality of the device. In order to achieve the purpose, the removal by manual may damage the sensitive chip. Typically, the image sensor module is formed by using a method of COB or LCC (Leadless Chip Carrier). One drawback of the COB is lower yield rate during packaging process due to particle contamination on sensing area. Besides, the drawbacks of the LCC are higher packaging cost and lower yield rate due to particle contamination on sensing area.

Further, micro lenses are optical components on semiconductors utilized as solid state imaging devices. One of the most important considerations in designing and manufacturing micro lenses is photosensitivity. One reason micro lens photosensitivity may be reduced is that the area of each micro lens has been reduced below an optimum value. The transparency is bad due to epoxy wearing out, and the potential reliability may be reduced. U.S. Pat. No. 5,514,888 for ON-CHIP SCREEN TYPE SOLID STATE IMAGE SENSOR AND MANUFACTURING METHOD THEREOF; issued May 7, 1996 to Yoshikazu Sano, et al. teaches a method for forming charge-coupled devices (CCDS) on a silicon substrate. A micro lens array is formed over the CCD array using conventional lithography and re-flow techniques.

In view of the aforementioned, the present invention provides an improved package structure to overcome the drawbacks.

SUMMARY OF THE INVENTION

Therefore, the main objective of the present invention is to provide a package for image sensor module that may connect to the main board without connector.

Another objective of the present invention is to provide the image senor with smaller foot print (form factor).

The yet objective of the present invention is to provide the image sensor module that is re-workable on the mother board (MB).

The present invention provides an image sensor module comprising a die formed on a substrate, said die having a micro lens area, a lens holder formed on said substrate and over said die, a lens formed in said lens holder. A filter is formed within said lens holder and between said lens and said die, and at least one passive device formed on said substrate and covered within said lens holder. A conductive bumps or LGA are formed on the bottom surface of said substrate. The die is connected to said conductive bumps via wires formed on said die. The image sensor is CMOS or CCD image sensor. The substrate includes ceramic, glass, resin material, quartz, metal, alloy, plastic material (PCB). The IR filtering layer comprises $TiO_2$ or light catalyzer.

In the present scheme, it is compatible with the COB, CSP type package, and the module can be linked to the mother board (MB) without the connector. Moreover, the present scheme may offers smaller foot print, it may reduce the device size. The solder joint terminal could be LGA, BGA. Further, the image sensor scheme may re-workable on the MB. The scheme may obtain highest yield during manufacturing in module/system assembly due to the protection layer is formed on the micro lens to avoid particle contamination during module assembly.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

Figure 1:
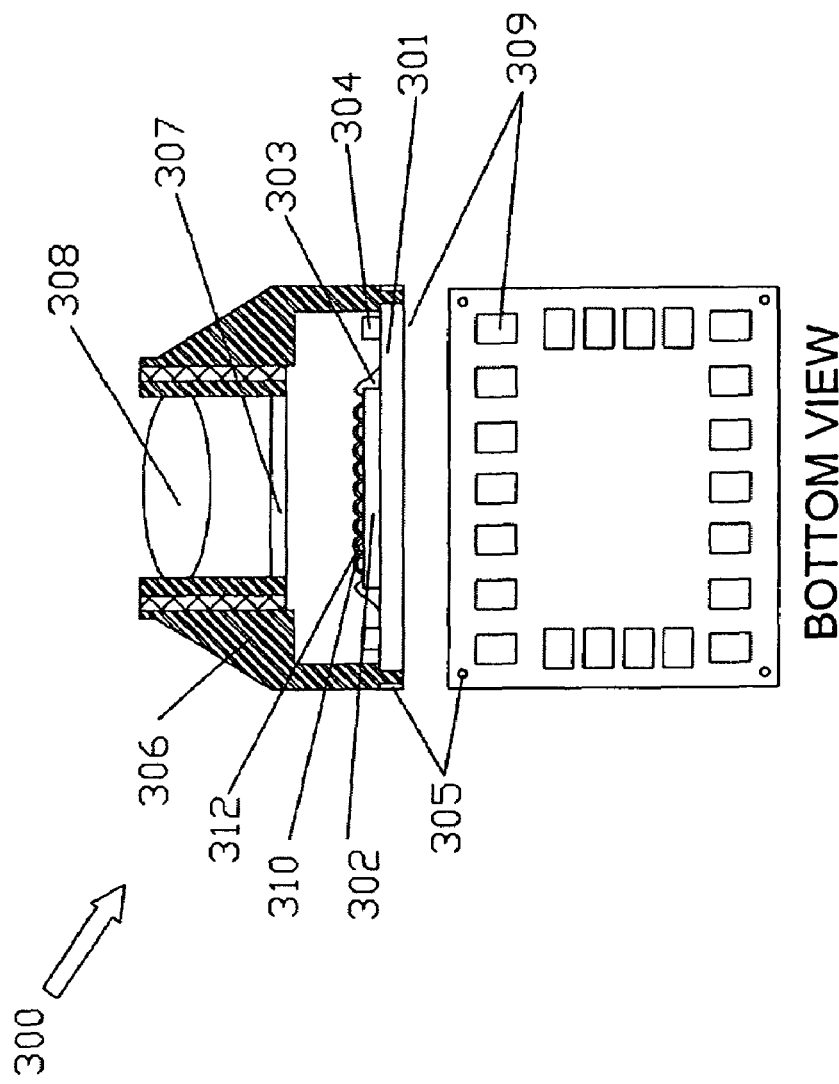
FIG. 1 is a schematic diagram of the image sensor module according to the present invention.

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims. Then, the components of the different elements are not shown to scale. Some dimensions of the related components are exaggerated and meaningless portions are not drawn to provide clearer description and comprehension of the present invention. The structure is adaptable to the CSP (Chip Scale Package), FBGA (Fine-pitch Ball Grid Array) and COB (Chip On Board) type package. The present invention benefits lower cost and more simple process than the conventional die package. The present scheme may solve the cost issue suffered by conventional package. Further, data processing speed of the FBGA package is far faster than conventional TSOP (Thin Small Outline Package) for inter-connection wires design.

The image sensor of the present invention includes CCD or CMOS sensor. Please refer to FIG. 1, the image sensor module 300 includes an image die 302 via adhesive film (not shown) formed on a substrate 301. The material of the adhesive film could be any suitable adhesive material. In one embodiment, the elastic material comprises BCB (BenzoCycloflutene), SINR (Siloxane polymer), epoxy, polyimides or resin. Besides, the elastic film may be formed by printing, coating or tapping method. The substrate 301 comprises glass, ceramic, plastic, resin, metal, alloy, silicon, PCB (Print Circuit Board) material or quartz. In one example, the substrate 301 could be PCB, BT, FR4, FR5. The thickness of the substrate 301 is about from 300 μm to 600 μm. Wires 303 are connected between the die 302 and the contact pad 309 formed under the substrate 301, the pads 309 maybe formed by copper, alumina or the alloy. Therefore, the signal may be output or input from the pads 309, the contact pad could be, for instance, the LGA terminal pins. A lens holder 306 is fixed on the substrate 301 to hold a lens 308. A filter 307, such as an IR filter, is fixed to the lens holder 306 and between the lens 308 and the die 302. Alternatively, the present invention may comprise a filtering layer formed over a glass to act as the IR filtering layer, the layer maybe coated on the upper or lower surface of the glass to act as a filter. In one embodiment, IR filtering layer comprises $TiO_2$, light catalyzer. The filter 307 may filtering the undesired IR radiation or/and prevent the micro lens 312 from particle containment. The user may use liquid or air flush to remove the particles on the glass without damaging the micro lens 312.

The micro lens area 312 is generally formed on the top surfaces of image sensor 302. A protection layer 310 is formed over the micro lens area 312 shown in FIG 1. Another layer is generally formed over the color filter layer. There are several ways well known to those skilled in the art to proceed with the formation of a micro lens. One material found suitable for the micro lens is a mixture of melamine resin and generic novolac base resin.

Referring to FIG 1, at least one passive device 304 maybe formed on the substrate adjacent to the die 302 and within the lens holder 306. From the package module structure 300, micro lenses 312 are formed on the top surfaces of the die 302. Contact pads 309 are located at the bottom surface of the substrate 301. An air space is created between the die 302 and the filter 307. The guide pins 305 of the lens holder 306 are formed into the substrate 301 to fix the lens holder 306. The shape of the substrate could be square, rectangular or other suitable shape. Preferably, the passive device 304 is formed within the lens holder 306 and the passive device 304 is shielded by the lens holder 306. The passive device includes but not limited to capacitor, resistor, inductor etc,. From FIG 1., the contact pads 309 are arranged around the periphery area of the substrate in the LGA scheme. Alternatively, the contacts are configured in a matrix form in the case of BGA type as shown in FIG. 2.

Figure 2:
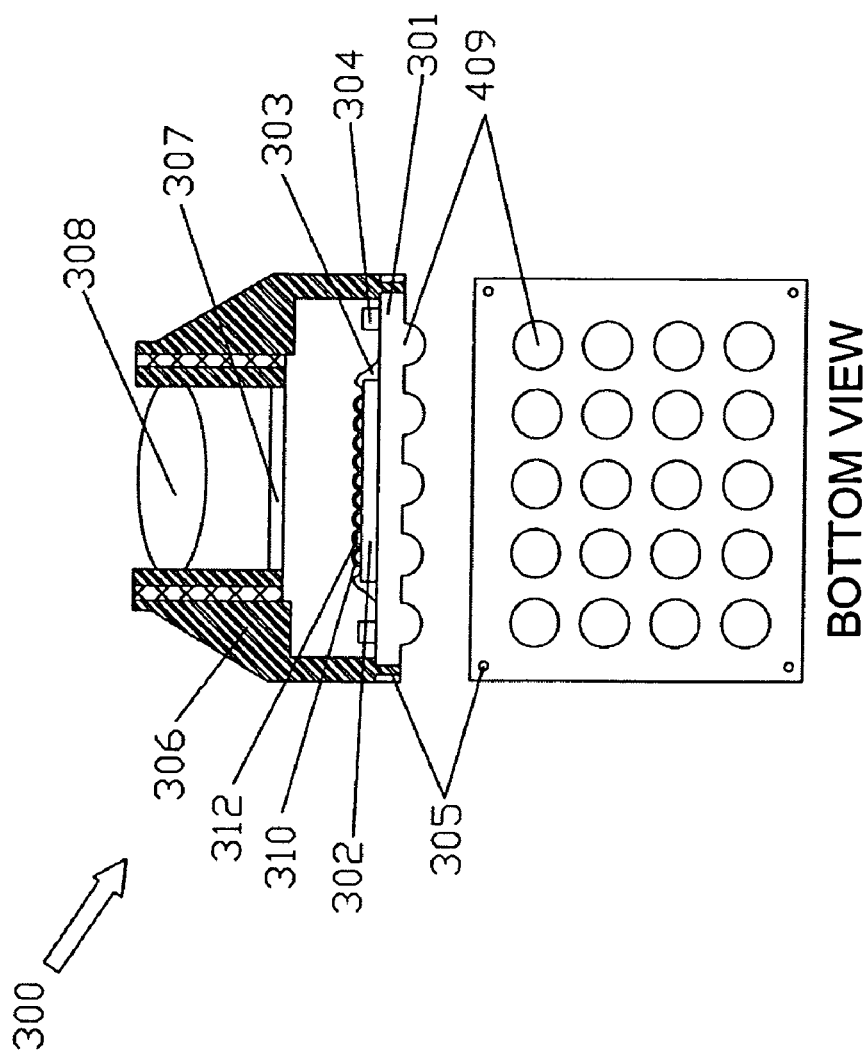
FIG. 2 is a schematic diagram of the image sensor module according to the present invention.
Figure 3:
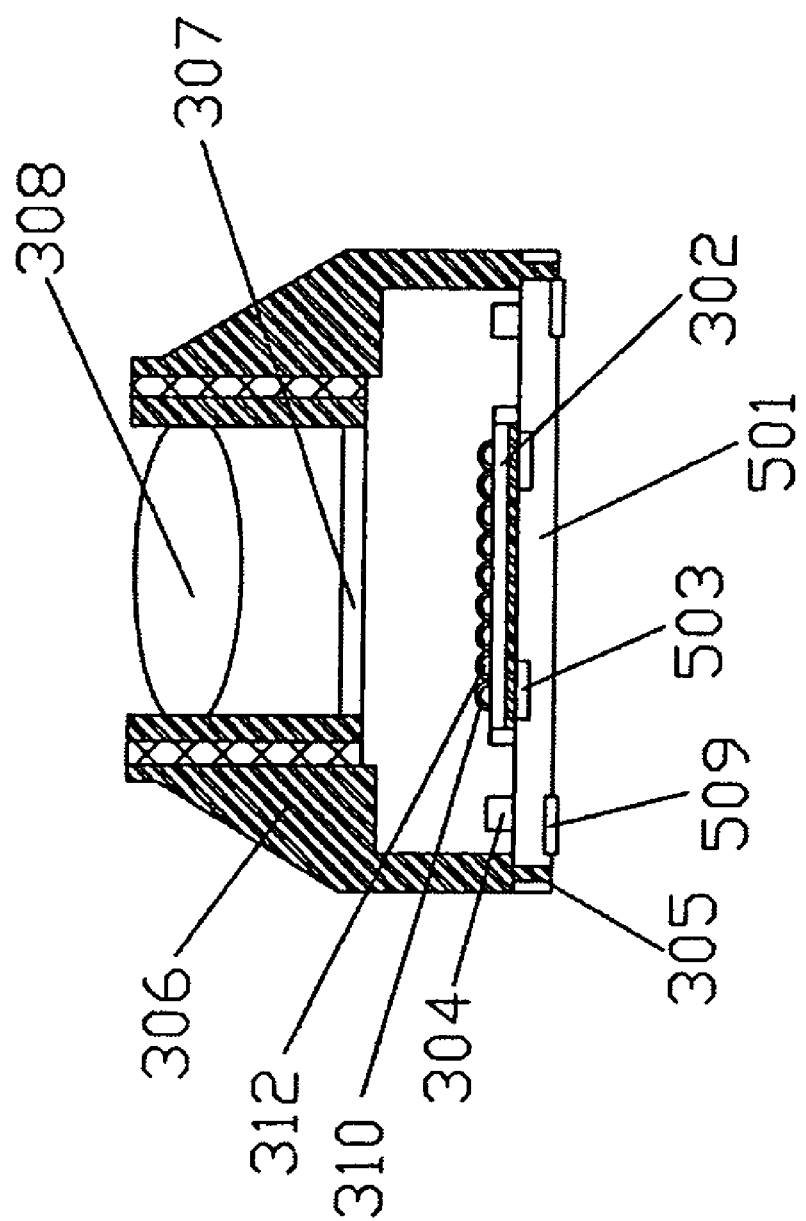
FIG. 3 is a schematic diagram of the image sensor module according to the present invention.

Referring to FIG 2, it shows another example of the present invention. Most of the scheme and arrangement are similar to the above embodiment, therefore, the similar description will be omitted to avoid redundancy. As shown in the illustration, wires 303 are coupled between the die 302 and the contact pads 309 which are formed at the under surface of the substrate 301, the contact pads 309 maybe formed by copper, alumina or the alloy. Therefore, the signal may be output or input from the pads 309, the contact pad could be, for instance, the LGA terminal pins. A lens holder 306 is attached on the substrate 301 to hold and receive the lens 308 and the filter 307 that is located between the lens 308 and the die 302. As can be seen from the illustration, the contact pads 309 are replaced by conductive bumps 409 in the figure. The scheme is referred to LGA type. Alternatively, a LGA (leadless grid array) soldering 503 is formed under the die 501 for the LGA scheme, as shown in FIG 3. In the case, there are no wires of the example illustrated in FIG. 1. The LGA (leadless grid array) soldering 503 is in a matrix form, and connected to the contact pad over the substrate 501. In the scheme, the die size is similar to one of package, namely, it is called chip scale package (CSP). No bonding wires are needed in the scheme, and the die is communicated to external through the LGA soldering 503 under the die 501 to the LGA soldering 509. The type is referred to CSP type with PL (protection layer) over the die 501. The PL may prevent the micro lens 312 from particle containment and the user may use liquid or air flush to remove the particles on the glass without damaging the micro lens 312.

The present scheme is adapted for the COB, CSP type package. The module may link to the mother board (MB) without the connector. SMT process is introduced to mount the CIS module onto the MB. The further benefit provided by the scheme is that the module offers smaller foot print. The solder joint terminal could be LGA, BGA. Moreover, the image sensor scheme may re-workable on the MB. The scheme may obtain highest yield during manufacturing in module/system assembly due to the protection layer is formed on the micron lens to avoid particle contamination.

In one embodiment, the protection layer material comprises transparent materials, and the protection materials may be formed by coating or gluing method. The substrate 301 comprises LGA pads or solder balls for connecting with external devices. In the module, a micro lens may be formed on the micro lens area, and the air space is created between the die 301 and the filter 307. The scheme may prevent the micro lens from particle containment. The user may use liquid or air flush to remove the particles on the glass without damaging the micron lens.

Although specific embodiments have been illustrated and described, it will be obvious to those skilled in the art that various modifications may be made without departing from what is intended to be limited solely by the appended claims.

Having described the invention, the following is claimed:

1. An image sensor module, comprising:
    a die formed on a substrate, wherein said die has a micro lens area formed thereon;
    a lens holder formed on said substrate and over said die;
    a lens formed in said lens holder;
    a filter formed within said lens holder and between said lens and said die;
    at least one passive device formed on said substrate and covered within said lens holder, wherein said passive device includes a capacitor, a resistor or an inductor;
    a first LGA (leadless grid array) solder formed on the bottom surface of said substrate; and
    a second LGA solder formed under said die,
    wherein said image sensor module electrically communicates externally through said first LGA solder without a connector.

2. The module in claim 1, wherein said die is connected to said first LGA solder via wires formed on said die.

3. The module in claim 1, wherein said image sensor is a CMOS image sensor.

4. The module in claim 1, wherein said image sensor is a CCD image sensor.

5. The module in claim 1, wherein said substrate includes ceramic, glass, resin material, quartz, metal, alloy, plastic material or PCB (Print Circuit Board) material.

6. The module in claim 1, wherein said filter is an IR filtering layer.

7. The module in claim 6, wherein said IR filtering layer comprises $TiO_2$ or light catalyzer.

8. The module in claim 1, wherein said first LGA solder comprises contact pads formed around the periphery area at the bottom surface of said substrate.

9. The module in claim 1, further comprises a protection layer formed on the micro lens area of said die.

10. The module in claim 9, wherein said protection layer comprises transparent materials.

11. An image sensor module, comprising:
- a die formed on a substrate, wherein said die has a micro lens area formed thereon;
- a lens holder formed on said substrate and over said die;
- a lens formed in said lens holder;
- a filter formed within said lens holder and between said lens and said die;
- at least one passive device formed on said substrate and covered within said lens holder;
- a first LGA (leadless grid array) solder formed on the bottom surface of said die; and
- a second LGA solder formed on the bottom surface of said substrate,
- wherein said image sensor module electrically communicates externally through said second LGA solder without a connector.

12. The module in claim 11, wherein said die is connected to said second LGA via said first LGA.

13. The module in claim 11, wherein said image sensor is a CMOS image sensor.

14. The module in claim 11, wherein said image sensor is a CCD image sensor.

15. The module in claim 11, wherein said substrate includes ceramic, glass, resin material, quartz, metal, alloy, plastic material or PCB (Print Circuit Board) material.

16. The module in claim 11, wherein said filter is an JR filtering layer.

17. The module in claim 16, wherein said IR filtering layer comprises $TiO_2$ or light catalyzer.

18. The module in claim 11, further comprises a protection layer formed on the micro lens area of said die.

19. The module in claim 11, wherein said protection layer comprises transparent materials.

* * * * *